(12) United States Patent
Huang et al.

(10) Patent No.: US 8,410,283 B2
(45) Date of Patent: Apr. 2, 2013

(54) ELECTROLYTE ADDITIVE OF DYE-SENSITIZED SOLAR CELL AND METHOD OF MAKING THE SAME

(75) Inventors: Sheng-Tung Huang, Taipei (TW); Chung-Kuang Yang, Taipei (TW)

(73) Assignee: National Taipei University of Technology (TW)

( * ) Notice: Subject to any disclaimer, the term of this patent is extended or adjusted under 35 U.S.C. 154(b) by 370 days.

(21) Appl. No.: 12/836,628

(22) Filed: Jul. 15, 2010

(65) Prior Publication Data

US 2012/0012775 A1   Jan. 19, 2012

(51) Int. Cl.
  *C07D 235/04*  (2006.01)
  *C07D 235/06*  (2006.01)
  *C07D 235/12*  (2006.01)
  *H01G 9/022*   (2006.01)
  *H01L 31/08*   (2006.01)
(52) U.S. Cl. ............... 548/304.4; 548/310.1; 548/305.7; 548/306.4; 252/62.2
(58) Field of Classification Search ............... 548/304.4, 548/310.1, 305.7, 306.4; 252/62.2; 136/263
See application file for complete search history.

(56) References Cited

PUBLICATIONS

Goncalves et al., Macromol. Symp. 2010, 290, 85-94.*
Garuti et al., Archiv der Pharmazie 1982, 315(12), 1007-13.*
Kusama et al.: Influence of Benzimidazole Additives in Electrolytic Solution on Dye-Sensitized Solar Cell Performance; Journal of Photochemistry and Photobiology A: Chemistry 162 (2004) 441-448.
O'Regan et al.: a Low-Cost, High-Efficiency Solar Cell Based on Dye-Sensitized Colloidal TIO2 Films; Letters to Nature, vol. 353, Oct. 24, 1991, pp. 737-740.
Kusama et al.: Influence of Alkylaminopyridine Additives in Electrolytes on Dye-Sensitized Solar Cell Performance; Solar Energy Materials & Solar Cells 81 (2004) 87-99.
Yin et al.: Synthesis of Pyridine Derivatives and Their Influence as Additives on the Photocurrent of Dye-Sensitized Solar Cells; J. Appl Electrochem (2009) 39: 147-154.

* cited by examiner

*Primary Examiner* — Jason M Nolan
(74) *Attorney, Agent, or Firm* — Schmeiser, Olsen & Watts, LLP

(57) ABSTRACT

An electrolyte additive is selected from N-alkyl benzimidazole derivatives and is applicable to dye-sensitized solar cells. Accordingly, the electrolyte additive can be added to electrolyte at low concentration, and loss of function due to crystallization after long-term use can be prevented; in addition, short circuit photocurrent density and solar energy-to-electricity conversion efficiency of solar cells incorporating the electrolyte additive can be increased.

12 Claims, No Drawings

ELECTROLYTE ADDITIVE OF DYE-SENSITIZED SOLAR CELL AND METHOD OF MAKING THE SAME

FIELD OF THE TECHNOLOGY

The present invention relates to an electrolyte additive and more particularly relates to an electrolyte additive used in dye-sensitized solar cells (DSSCs) for increasing its solar energy-to-electricity conversion efficiency.

BACKGROUND

Due to the gradual depletion of fossil fuel and deterioration of environmental problems, many countries have paid much attention to the development and utilization of solar energy. Solar cells, which can convert solar energy into electricity, can be generally divided into the following groups: silicon solar cells, compound semiconductor solar cells, dye-sensitized solar cells and organic solar cells. Among all kinds of solar cells, monocrystalline silicon solar cells, polycrystalline silicon solar cells, and compound semiconductor solar cells are very expensive in terms of their material costs and are not eco-friendly, and organic solar cells have a reputation of low conversion efficiency and are therefore not suitable for large-scale commercial application. Accordingly, major research institutes are dedicated to developing alternative material and relevant technologies to reduce the fabrication costs and increase solar energy-to-electricity conversion efficiency.

Dye-sensitized solar cells have become the mainstream of the solar energy development due to their low cost, high efficiency, simple assembly and other advantages. Published by O'Regan and Grätzel in 1991, dye-sensitized solar cells use a porous film of nano-scale titanium dioxide ($TiO_2$) as the working electrode, on which ruthenium bipyridine complexes (such as the N719) are adsorbed as a photosensitizer dye. Redox electrolyte comprising iodide/triodide ($I^-/I_3^-$) is used as the electrolyte, and platinum-sputtered conductive glass is used as the counter electrode.

According to the operation principle of dye-sensitized solar cells, electrons of valence shell in the ruthenium dyes for light absorption are excited by light and jump to a higher energy level. Then the electrons are transmitted to the conductive layer of the nano-scale titanium dioxide semiconductor and led to an external circuit by the working electrode. The oxidized dyes obtaining electrons from the electrolyte of the cell are reduced to the initial state, and the circuit loop is completed after the electrolyte acquires electrons from the external circuit via the counter electrode.

Conventional electrolyte is organic solvent containing iodide/triodide; however, due to the low boiling point, volatility, high mobility of the organic solvent, this kind of electrolyte is not suitable for sealing of cells and long-term use. In addition, research found that liquid electrolyte can be replaced with polymer electrolyte in order to drastically increase the stability of solid-state dye-sensitized solar cells. However, the polymer electrolyte has low conductivity, and its electrode interface has poor infiltration, so the solar energy-to-electricity conversion efficiency of the solid-state batteries is far less than the liquid-state batteries. In recent years, ionic liquid used to replace organic solvent as the electrolyte in dye-sensitized solar cells has been studied extensively. Ionic liquid has high conductivity, low volatility, stable physical and chemical properties, wide range of working range, and high dielectric constant; therefore, the use of ionic liquid as the electrolyte in dye-sensitized solar cells overcomes the shortcomings of volatile liquid electrolyte. Grätzel and others utilized ionic liquid as the electrolyte of dye-sensitized solar cells and found that the solar energy-to-electricity conversion efficiency was raised up to 7% (with photon flux 100 $mW/cm^2$); however, the high fluidity of the electrolyte is detrimental to battery sealing.

In recent years, the solar energy-to-electricity conversion efficiency of dye-sensitized solar cells with liquid electrolyte has been improved to 7-12%. one of main effects on the solar energy-to-electricity conversion performance of dye-sensitized solar cells is a stable and effective redox reaction which allows the stable and balanced existence of electrons and holes in different layers of the cells. Accordingly, how to improve the constitution of electrolyte material to enhance the solar energy-to-electricity conversion efficiency of dye-sensitized solar cells has become an urgent issue to researchers all over the world.

Many studies have been focused on the addition of additives into the electrolyte, such as 4-tert-butyl pyridine (4-TBP), benzimidazole, N-methyl benzimidazole (NMBI), to enhance the solar energy-to-electricity conversion efficiency ($\eta$ %). Although the conventional electrolyte additives can increase the open circuit voltage (Voc) to enhance the solar energy-to-electricity conversion efficiency, the amount needed to be added is very high; furthermore, long-term use will result in crystallization in the cells, resulting the loss of their original functions and making the solar energy-to-electricity conversion efficiency instable. In addition, the conventional additives decrease the short circuit photocurrent density (Jsc), which causes the solar energy-to-electricity conversion efficiency cannot be optimized.

Therefore, it is the main objective of the present invention to discover an electrolyte additive that can be added to the electrolyte with a low concentration, and can be long-term used without resulting in crystallization in the cells and the loss of original functions. The additive also can provide an improvement in the short circuit current density and the solar energy-to-electricity conversion efficiency of solar cells.

SUMMARY

The features and advantages of the present invention will become more fully apparent from the following description and appended claims, or may be learned by the practice of the invention as set forth thereinafter.

In view of the foregoing shortcomings of the conventional electrolyte additives, the present invention provides an electrolyte additive used in dye-sensitized solar cells to increase the short circuit current density and the solar energy-to-electricity conversion efficiency.

The main objective of the present invention is to provide an electrolyte additive that can be added to the electrolyte with a low concentration, and can be long-term used without resulting in crystallization in the cells and the loss of original functions. The additive also can provide an improvement in the short circuit current density and the solar energy-to-electricity conversion efficiency of solar cells.

The electrolyte additive of the present invention is selected from the group consisting of a compound of formula (1), a compound of formula (2), and a combination thereof:

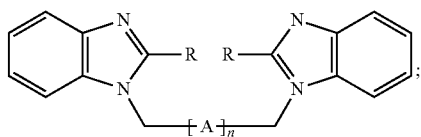

formula (1)

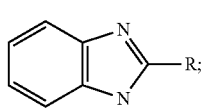

formula (2)

wherein each of n, l, m is independently between 0 and 20, with the proviso that l and m cannot be 0 at the same time;

R represents hydrogen, alkyl, alkoxy, alkenyl, alkynyl, alkoxy-alkyl, a polyether group or phenyl, the number of carbon atom of R is between 0 and 20, and R is either linear or branched; and A represents methylene or $CH_2OCH_2$.

Of the aforementioned electrolyte additive, R represents hydrogen or $CH(OH)CH_3$.

The aforementioned electrolyte additive may be applicable to dye-sensitized solar cells.

Of the aforementioned electrolyte additive, A represents methylene and n is between 1 and 10.

The aforementioned electrolyte additive may be adapted to increase a short circuit current density and/or solar energy-to-electricity conversion efficiency of a dye-sensitized solar cell.

Of the aforementioned electrolyte additive, the addition amount is between a range of 0.01M to 0.5 M and preferably 0.01M to 0.25 M.

This invention also provides a method of preparing an electrolyte additive, comprising the following steps:

(a) providing a compound of formula (3)

formula (3)

and (b) providing an effective amount of halide to interact with the compound of formula (3), wherein the halide is selected from alkyl halide, alkyl dihalide, alkoxy halide, alkoxy dihalide or a combination thereof, and the number of carbon atom of the halide is between 0 and 20;

wherein R represents hydrogen, alkyl, alkoxy, alkenyl, alkynyl, alkoxy-alkyl, a polyether group or phenyl, the number of carbon atom of R is between 0 and 20, and R is either linear or branched.

Of the aforementioned method, the reaction is proceeded under a temperature of 70° C. with a reaction time of at least 12 hours.

In the aforementioned method, methyltrioctylammonium chloride is also provided in step (b).

In the aforementioned method, dimethyl sulfoxide (DMSO) is also provided in step (a).

Of the aforementioned method, the halide is oligo(ethyleneglycol) dichloride.

Accordingly, this invention provides an electrolyte additive that can be added to the electrolyte with a low concentration, and can be long-term used without resulting in crystallization and the loss of original functions. The additive also can provide an improvement in the short circuit current density and the solar energy-to-electricity conversion efficiency of solar cells.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Synthesis of Benzimidazole Derivatives of Formulae 1-12

100 mmol of benzimidazole or 2-(1-hydroxyethyl)benzimidazole was dissolved in 80 mL of toluene, and enough DMSO (about 13 mL) was added to dissolve benzimidazole or 2-(1-hydroxyethyl)benzimidazole at 80° C. Then methyltrioctylammonium chloride (2.2 g, 5.5 mmol) in toluene (5 mL), the appropriate oligo(ethyleneglycol) dichloride (55 mmol), and 18 N aq. sodium hydroxide solution (15 mL) were added. The mixture was stirred overnight (for at least 12 h) at 80° C. The mixture was allowed to cool to room temperature. The product was purified either by recrystallization or by extraction, followed by column chromatography ($SiO_2$, $CH_2Cl_2$— ethanol 95:5 or 90:10).

The yields of the benzimidazole derivatives of formulae l-12 were approximately in a range of 36-63%, and the nuclear magnetic resonance (NMR) data are as follows:

1,5-Bis(1'-benzimidazolyl)-3-oxapentane (1). $^1$H NMR (DMSO-d6) δ 3.72 (t, 4H, J=5.05 Hz), 4.35 (t, 4H, J=5.03 Hz), 7.19-7.23 (m, 4H), 7.51-7.56 (m, 2H), 7.64-7.68 (m, 2H), 8.11 (s, 2H); $^{13}$C NMR (DMSO-d6) δ 44.2, 69.0, 110.6, 119.5, 121.5, 122.3, 134.0, 143.5, 144.4.

1,8-Bis(1'-benzimidazolyl)-3,6-dioxaoctane (2). $^1$H NMR (DMSO-$d_6$) δ 3.41 (s, 4H), 3.65 (t, 4H, J=5.0 Hz), 4.32 (t, 4H, J=5.0 Hz), 7.20-7.28 (m, 4H), 7.57 (d, 2H, J=7.6 Hz), 7.68 (d, 2H, J=7.6 Hz), 8.19 (s, 2H); $^{13}$C NMR (DMSO-$d_6$) δ 44.3, 68.9, 69.7, 110.6, 119.5, 121.5, 122.3, 134.1, 143.5, 144.5.

1,11-Bis(1'-benzimidazolyl)-3,6,9-trioxaundecane (3). $^1$H NMR (DMSO-$d_6$) δ 3.35-3.40 (m, 4H), 3.40-3.47 (m, 4H), 3.73 (t, 4H, J=5.03 Hz), 4.38 (t, 4H, J=5.01 Hz), 7.18-7.27 (m, 4H), 7.59-7.67 (m, 4H), 8.19 (s, 2H); $^{13}$C NMR (DMSO-$d_6$) δ 44.3, 68.9, 69.8, 110.7, 119.5, 121.5, 122.3, 134.1, 143.5, 144.5

1-[1-(2-{2-[2-(1-Hydroxy-ethyl)-benzoimidazol-1-yl]-ethoxy}-ethyl)-1H-benzoimidazol-2-yl]-ethanol (4). $^1$H NMR: (500 MHz, CDCl$_3$): δ=7.72 (dd, J=3.0. 8.1 Hz, 2H), 7.25-7.21 (m, 6H), 5.03 (q, J=6.5 Hz, 2H), 4.27 (t, J=5.1 Hz, 1H), 4.26 (t, J=5.1 Hz, 1H), 4.24 (t, J=5.1 Hz, 1H), 4.23 (t, J=5.1 Hz, 1H), 3.74-3.67 (m, 4H), 1.66 (d, J=6.5 HZ, 6H,). $^{13}$C-NMR: (125 MHz, CDCl$_3$): δ=156.4, 141.9, 135.2, 122.9, 122.3, 119.9, 109.4, 69.7, 63.0, 43.6, 22.2.

1-{1-[2-(2-{2-[2-(1-Hydroxy-ethyl)-benzoimidazol-1-yl]-ethoxy}-ethoxy)-ethyl]-1H-benzoimidazol-2-yl}-ethanol (5). $^1$H-NMR: (500 MHz, CDCl$_3$, ppm): δ=7.75-7.74 (m, 2H), 7.27-7.25 (m, 2H), 7.24-7.20 (m, 4H), 5.11 (q, J=6.5, 2H), 4.39 (t, J=3.8 Hz, 1H), 4.36 (t, J=3.8 Hz, 1H), 4.30-4.29 (m, 1H), 4.28-4.27 (m, 1H), 3.64-3.60 (m, 2H), 3.56-3.55 (m, 2H), 3.33 (s, 4H), 1.71 (d, 6H, J=6.5 HZ). $^{13}$C-NMR: (125 MHz, CDCl$_3$, ppm): δ=156.6, 142.0, 135.0, 122.6, 122.2, 119.9, 109.6, 70.1, 69.0, 62.0, 43.6, 21.3.

1-(1-{2-[2-(2-{2-[2-(1-Hydroxy-ethyl)-benzoimidazol-1-yl]-ethoxy}-ethoxy)-ethoxy]-ethyl}-1H-benzoimidazol-2-yl)-ethanol (6). $^1$H NMR: (500 MHZ, CDCl$_3$): δ=7.69 (dd, J=3.8, 7.1 Hz, 2H), 7.24-7.22 (m, 2H), 7.20-7.16 (m, 4H), 5.17 (q, J=6.5 Hz, 2H), 4.49 (t, J=4.0 Hz, 1H), 4.45 (t, J=4.0 Hz, 1H), 4.35-4.29 (m, 2H), 3.73-3.66 (m, 4H), 3.35-3.21 (m, 8H), 1.68 (d, J=6.5 Hz, 6H). $^{13}$C-NMR: (125 MHz, CDCl$_3$, ppm): δ=156.9, 141.8, 134.8, 122.5, 122.0, 119.5, 70.3, 68.0, 68.9, 62.2, 43.7, 21.6.

1,1-(1,5-Pentanediyl)bis[benzimidazole] (7). $^1$H NMR (CDCl$_3$) δ=7.83 (s, 2H), 7.81 (m, 2H), 7.30 (m, 6H), 4.12 (t, 4H, J) 7.2 Hz), 1.89 (quintet, 4H, J) 7.2 Hz), 1.35 (quintet, 2H, J) 7.2 Hz); $^{13}$C NMR (CDCl$_3$) δ=143.84, 142.78, 133.66, 123.02, 122.23, 120.51, 109.52, 44.78, 29.49, 24.27.

1,1-(1,8-Octanediyl)bis[benzimidazole] (8). $^1$H NMR (CDCl$_3$) δ=7.85 (s, 2H), 7.80 (m, 2H), 7.36 (m, 2H), 7.28 (m, 4H), 4.13 (t, 4H, J) 7.2 Hz), 1.84 (broad quintet, 4H, J) 7.2 Hz), 1.28 (broad, 8H); $^{13}$C NMR (CDCl$_3$) δ=143.78, 142.89, 133.74, 122.80, 122.02, 120.29, 109.65, 44.98, 29.62, 28.81, 26.59.

1-(1-{5-[2-(1-Hydroxy-ethyl)-benzoimidazol-1-yl]-pentyl}-1H-benzoimidazol-2-yl)-ethanol (9). $^1$H NMR (500 MHz, CDCl$_3$) δ=7.68 (dd, J=3.7, 8.6 Hz, 2H), 7.25-7.20 (m, 6H), 5.05 (q, J=6.5 Hz, 2H), 4.25-4.21 (m, 2H), 4.14-4.08 (m, 2H), 1.90-1.82 (m, 4H,), 1.79 (d, J=6.5 Hz, 6H), 1.45 (quintet, 2H, J=7.6 HZ). $^{13}$C-NMR: (125 MHz, CDCl$_3$) δ=156.1, 149.1, 141.8, 135.2, 122.8, 122.2, 119.7, 63.2, 43.7, 29.2, 24.3, 22.6.

1-(1-{8-[2-(1-Hydroxy-ethyl)-benzoimidazol-1-yl]-octyl}-1H-benzoimidazol-2-yl)-ethanol (10). $^1$H NMR (500 MHz, CDCl$_3$) δ=7.72-7.70 (m, 2H), 7.30-7.27 (m, 2H), 7.25-7.21 (m, 4H), 5.05 (q, J=6.4 Hz, 2H), 4.22-4.18 (m, 2H), 4.13-4.07 (m, 2H), 1.83-1.73 (m, 4H,), 1.70 (d, J=6.4 Hz, 6H), 1.30-1.25 (m, 8H,). $^{13}$C-NMR (125 MHz, CDCl$_3$) δ=156.2, 134.5, 123.5, 123.1, 123.1, 118.5, 110.2, 62.9, 44.4, 29.7, 29.6, 28.7, 26.5, 22.7.

2-[2-(2-Benzoimidazol-1-yl-ethoxy)-ethoxy]-ethanol (11). $^1$H-NMR: (500 MHz, CDCl$_3$) δ=8.02 (s, 1H), 7.74 (dd, J=2.1. 6.2 Hz, 1H), 7.34 (dd, J=2.1. 6.2 Hz, 1H), 7.26-7.20 (m, 2H), 4.26 (t, J=5.2 Hz, 2H), 3.75 (t, J=5.2 Hz, 2H), 3.66 (t, J=4.7 Hz, 2H), 3.50-3.45 (m, 7H). $^{13}$C-NMR (125 MHz, CDCl$_3$) δ=143.9, 143.1, 133.5, 122.7, 122.0, 119.9, 109.4, 72.5, 70.5, 70.0, 69.0, 61.2, 44.7.

1-(1-{2-[2-(2-Hydroxy-ethoxy)-ethoxy]-ethyl}-1H-benzoimidazol-2-yl)-ethanol (12). $^1$H-NMR (500 MHZ, CDCl$_3$) δ=7.75-7.73 (m, 1H), 7.25-7.20 (m, 3H), 5.14 (q, J=6.5 Hz, 1H), 4.44-4.42 (m, 2H), 3.82-3.77 (m, 2H), 3.62-3.59 (m, 2H), 3.53-3.40 (m, 6H), 1.72 (d, 3H, J=6.5 Hz). $^{13}$C-NMR: (500 MHz, CDCl$_3$) δ=156.4, 142.1, 136.9, 134.6, 122.7, 122.3, 120.0, 109.2, 74.0, 73.0, 70.4, 69.3, 68.8, 61.5, 61.3, 43.7, 30.3, 20.5.

Chemical structures of the benzimidazole derivatives in accordance with formulae I-12 are shown below:

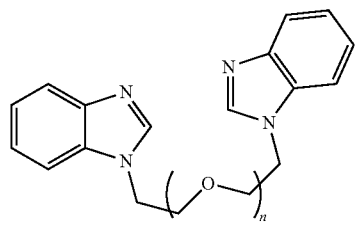

1. n = 1
2. n = 2
3. n = 3

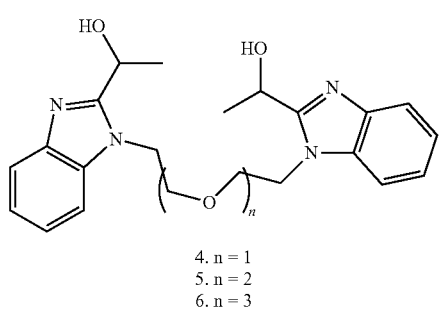

4. n = 1
5. n = 2
6. n = 3

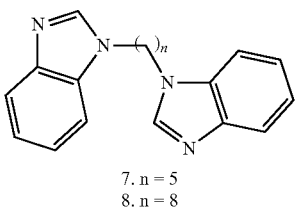

7. n = 5
8. n = 8

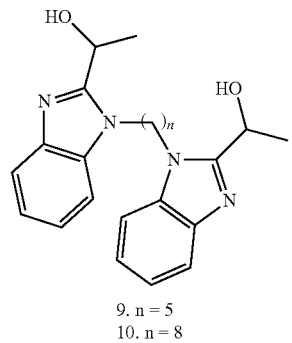

9. n = 5
10. n = 8

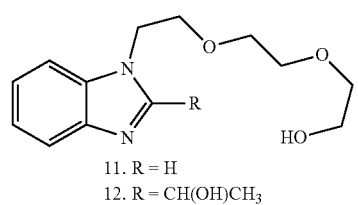

11. R = H
12. R = CH(OH)CH$_3$

Synthetic scheme for formulae I-12 is shown below:

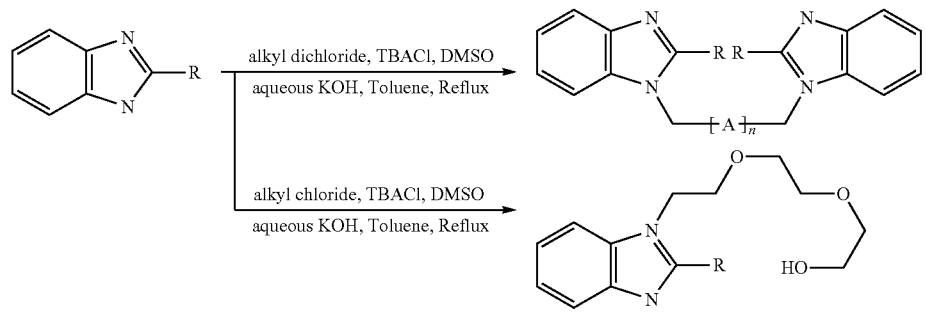

Examples 1-12 and Comparative Examples 1-3

An N719 adsorbed nano-TiO$_2$ electrode and Pt-counter electrode were assembled into a sandwich sealed type cell by heating with hot-melt ionomer film (25 μm thickness, Solaronix) as a spacer. A drop of electrolyte solution (0.1 M LiI, 0.05 M I$_2$, 0.5 M PMII(1-propyl-3-methylimidazolium iodide); 0.6 M tert-butyl pyridine in 3-methoxypropionitile (3 MPN)) and one of benzimidazole derivatives of formulae 1-12 (0.01 M-0.5 M) were injected through a hole in the counter electrode, which was then sealed with hot-melt ionomer film and glass. The working area of the electrode is 0.25 cm$^2$. In addition, three comparative examples were prepared by following the aforementioned process and replacing benzimidazole derivatives of formulae 1-12 with other additives or not adding any additive. The results are shown in Table 1, in which the solar energy—to electricity conversion efficiency, η %, is obtained from the following equation:

$$\eta(\%) = \frac{J_{sc}[\text{mA cm}^{-2}] \times V_{oc}[\text{V}] \times f\!f}{I_0[\text{mW cm}^{-2}]} \times 100\%$$

where I$_0$ is the photon flux (100 mW/cm$^2$ for AM 1.5), J$_{sc}$ is the short circuit photocurrent density, V$_{oc}$ indicates the open circuit voltage and ff represents the fill factor.

TABLE 1

| Additive | J$_{sc}$ (mA/cm$^2$) | V$_{oc}$(V) | FF | η (%) |
| --- | --- | --- | --- | --- |
| Comparative example (1) | 12.21 | 0.68 | 0.568 | 4.72 |
| 0.5M Comparative example (2) | 11.97 | 0.72 | 0.632 | 5.45 |
| 0.5M Comparative example (3) | 12.29 | 0.71 | 0.659 | 5.75 |
| 0.5M Formula (1) | 8.60 | 0.81 | 0.505 | 3.52 |
| 0.5M Formula (2) | 7.07 | 0.75 | 0.578 | 3.07 |
| 0.5M Formula (3) | 9.64 | 0.79 | 0.604 | 4.59 |
| 0.5M Formula (4) | 8.65 | 0.79 | 0.609 | 4.17 |
| 0.25M Formula (5) | 8.99 | 0.76 | 0.433 | 2.96 |
| 0.5M Formula (6) | 7.17 | 0.76 | 0.529 | 2.89 |
| 0.5M Formula (7) | 8.20 | 0.76 | 0.621 | 3.87 |
| 0.1M Formula (8) | 12.21 | 0.72 | 0.609 | 5.35 |
| 0.02M Formula (9) | 14.47 | 0.72 | 0.636 | 6.63 |
| 0.01M Formula (10) | 12.34 | 0.71 | 0.488 | 4.28 |
| 0.5M Formula (11) | 5.39 | 0.73 | 0.669 | 2.63 |
| 0.5M Formula (12) | 9.26 | 0.74 | 0.607 | 4.16 |

Comparative example (1): No additive is added
Comparative example (2): 4-tert-butyl pyridine
Comparative example (3): 2-(1-hydroxyethyl)benzimidazole Table 1 shows that the solar-energy-to-electricity conversion efficiency and the fill factor are in the range of 2.36-6.63% and 0.433-0.669 respectively, and the short circuit photocurrent density and the open circuit voltage are in the range of 5.39-14.47 mA/cm$^2$ and 0.71-0.81 V respectively. An overall conversion efficiency of 6.63% is achieved from the DSSC based on the additive of formula 9, which is even higher than that of 4-tert-butyl pyridine or 2-(1-hydroxyethyl) benzimidazole. In addition, formula 9 also shows a highest short circuit photocurrent density; it can increase the short circuit current density at a low concentration (0.02M) and possess a solar-energy-to-electricity conversion efficiency 10% higher than cells containing conventional additives (0.5M). Accordingly, it can be observed that benzimidazole derivatives of formulae 1-12 demonstrate desirable additive performance when applied to DSSCs.

As mentioned above, this invention is fully comply with the requirements of novelty, nonobviousness, and utility. Regarding novelty and nonobviousness, this invention uses a one-step process to synthesize benzimidazole derivatives which, when used as the electrolyte additive of DSSCs, can be added at a low concentration into the electrolyte and can still maintain their original function after long-term use, thereby providing an improvement in the short circuit current density and the solar energy-to-electricity conversion efficiency of solar cells. Regarding utility, products containing the present invention can undoubtedly meet the market needs.

Thus, while the present invention has been fully described above with particularity and detail in connection with what is presently deemed to be the most practical and preferred embodiment of the invention, it will be apparent to those of ordinary skill in the art that numerous modifications, including, but not limited to, variations in size, materials, shape, form, function and manner of operation, assembly and use may be made, without departing from the principles and concepts of the invention as set forth in the claims.

What is claimed is:

1. An electrolyte additive selected from the group consisting of a compound of formula (1), a compound of formula (2), and a combination thereof:

formula (1)

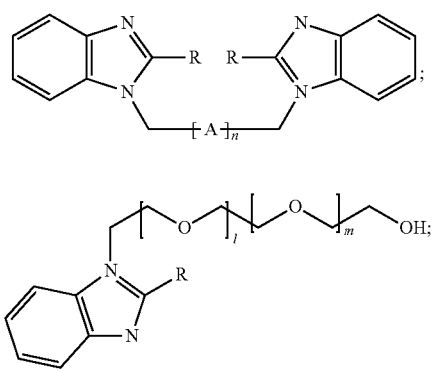

formula (2)

wherein each of l and m is independently between 0 and 20, with the proviso that l and m cannot be 0 at the same time;

R represents hydrogen, alkyl, alkoxy, alkenyl, alkynyl, alkoxy-alkyl, a hydroxyl-substituted alkyl, a polyether group or phenyl, the number of carbon atom of R is between 0 and 20, and R is either linear or branched; and A represents methylene and n is between 1 and 10;

wherein the electrolyte additive is adapted to increase a short circuit current density and/or solar energy-to-electricity conversion efficiency of a dye-sensitized solar cell.

2. The electrolyte additive of claim 1, wherein the R represents CH(OH)CH$_3$.

3. The electrolyte additive of claim 1, an addition amount of the electrolyte additive being in a range of 0.01M to 0.5 M.

4. The electrolyte additive of claim 1, an addition amount of the electrolyte additive being in a range of 0.01M to 0.5 M.

5. A method of preparing the electrolyte additive of claim 1, comprising the following steps:

(a) providing a compound of formula (3)

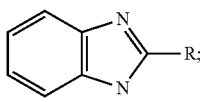

formula (3)

and (b) providing an effective amount of halide to interact with the compound of formula (3), wherein the halide is selected from alkyl halide, alkyl dihalide, alkoxy halide, alkoxy dihalide or a combination thereof, and the number of carbon atom of the halide is between 0 and 20;

wherein R represents hydrogen, alkyl, alkoxy, alkenyl, alkynyl, alkoxy-alkyl, a polyether group or phenyl, the number of carbon atom of R is between 0 and 20, and R is either linear or branched.

6. The method of claim 5, wherein the reaction is proceeded under a temperature of 70° C. with a reaction time of at least 12 hours.

7. The method of claim 5, wherein methyltrioctylammonium chloride is also provided in step (b).

8. The method of claim 6, wherein methyltrioctylammonium chloride is also provided in step (b).

9. The method of claim 5, wherein dimethyl sulfoxide is also provided in step (a).

10. The method of claim 6, wherein dimethyl sulfoxide is also provided in step (a).

11. The method of claim 5, wherein the halide is oligo (ethyleneglycol) dichloride.

12. The method of claim 6, wherein the halide is oligo (ethyleneglycol) dichloride.

* * * * *